United States Patent
Chen et al.

(10) Patent No.: US 9,087,703 B1
(45) Date of Patent: Jul. 21, 2015

(54) TOUCH PANEL AND A BONDING STRUCTURE AND METHOD THEREOF

(71) Applicant: HengHao Technology Co., LTD, Hsinchu County (TW)

(72) Inventors: Ting-Chieh Chen, Taoyuan County (TW); Chin-Liang Chen, Kaohsiung (TW)

(73) Assignee: Henghao Technology Co. Ltd., Hsinchu County (TW)

( * ) Notice: Subject to any disclaimer, the term of this patent is extended or adjusted under 35 U.S.C. 154(b) by 0 days.

(21) Appl. No.: 14/461,062

(22) Filed: Aug. 15, 2014

(30) Foreign Application Priority Data

Jun. 17, 2014 (TW) .............................. 103120925 A

(51) Int. Cl.
*H01L 23/02* (2006.01)
*H01L 23/00* (2006.01)

(52) U.S. Cl.
CPC ....... *H01L 24/06* (2013.01); *H01L 2224/32225* (2013.01)

(58) Field of Classification Search
CPC ..... H01L 24/06; H01L 24/05; H01L 23/5387; H01L 2224/32225; H01L 21/76877; H01L 2224/73204
USPC .......... 257/786, 784, 782, 701; 438/125, 118, 438/119
See application file for complete search history.

(56) References Cited

U.S. PATENT DOCUMENTS

| | | | |
|---|---|---|---|
| 5,221,417 A * | 6/1993 | Basavanhally | 216/22 |
| 7,960,830 B2 * | 6/2011 | Lu | 257/737 |
| 2013/0112989 A1 * | 5/2013 | Tischler et al. | 257/76 |
| 2013/0264103 A1 * | 10/2013 | Ye et al. | 174/254 |

FOREIGN PATENT DOCUMENTS

TW  200808148 A  2/2008
TW  M467117 U  12/2013

OTHER PUBLICATIONS

Office Action Dated Mar. 9, 2015 in corresponding Taiwan Patent Application No. 103120925.

* cited by examiner

*Primary Examiner* — S. V. Clark
(74) *Attorney, Agent, or Firm* — Donald E. Stout; Stout, Uxa & Buyan, LLP

(57) ABSTRACT

A bonding structure includes a first substrate, a second substrate, a printed circuit board (PCB) disposed between the first substrate and the second substrate, anisotropic conductive adhesive (ACA) and conductive wires. The ACA is disposed between second connecting bonding pads of the first substrate and second bonding pads of the second substrate. First bonding pads of the first substrate are bonded with corresponding first matching bonding pads of the PCB, and second duplicated bonding pads of the first substrate are bonded with second matching bonding pads of the PCB, wherein the first and the second matching bonding pads are disposed on the same surface of the PCB. The second connecting bonding pads and the corresponding second duplicated bonding pads are electrically coupled via the conductive wires.

14 Claims, 4 Drawing Sheets

TOUCH PANEL AND A BONDING STRUCTURE AND METHOD THEREOF

CROSS-REFERENCE TO RELATED APPLICATIONS

The entire contents of Taiwan Patent Application No. 103120925, filed on Jun. 17, 2014, from which this application claims priority, are incorporated herein by reference.

1. Field Of The Invention

The present invention generally relates to a bonding structure and method, and more particularly to a bonding structure and method of a touch panel.

2. Description Of Related Art

A touch panel is primarily operated by inputting driving signals and outputting sense signals in sequence. The driving signals and the sense signals are commonly transferred between the touch panel and other components (such as a processor) via a flexible printed circuit board (PCB).

FIG. 1 shows a side view of a bonding structure 100 of a conventional touch panel, the bonding structure 100 mainly including a glass substrate 11, a transparent substrate 12 and a flexible PCB 13. First bonding pads 111 of the glass substrate 11 are opposite first matching bonding pads 131 of the flexible PCB 13, and second bonding pads 121 of the transparent substrate 12 are opposite second matching bonding pads 132 of the flexible PCB 13, where the first matching bonding pads 131 and the second matching bonding pads 132 are disposed on opposite surfaces of the flexible PCB 13, respectively.

When the bonding structure 100 is subjected to bonding, the second bonding pads 121 of the transparent substrate 12 are first bonded with the corresponding second matching bonding pads 132 of the flexible PCB 13, followed by bonding the first bonding pads 111 of the glass substrate 11 with the corresponding first matching bonding pads 131 of the flexible PCB 13. In other words, the two opposite surfaces of the flexible PCB 13 need be dealt with in sequence to accomplish the bonding structure 100 in the conventional touch panel. The two-step bonding process is relevant to yield of the bonding structure 100.

A need has thus arisen to propose a novel bonding structure and method in order to simplify the bonding process of the touch panel and to effectively enhance yield of the bonding structure.

SUMMARY OF THE INVENTION

In view of the foregoing, it is an object of the embodiment of the present invention to provide a bonding structure and method, which utilize a single-step bonding process performed on a single surface of a printed circuit board in coordination with a use of anisotropic conductive adhesive (ACA), therefore effectively enhancing yield of the bonding structure.

According to one embodiment, a bonding structure includes a first substrate, a second substrate, a printed circuit board, anisotropic conductive adhesive and conductive wires. The printed circuit board is disposed between the first substrate and the second substrate, the anisotropic conductive adhesive is disposed between the first substrate and the second substrate, and the conductive wires are disposed on the first substrate. First bonding pads are disposed on a surface of the first substrate facing the printed circuit board, and first matching bonding pads are disposed on a surface of the printed circuit board facing the first substrate and opposing the first bonding pads. Second bonding pads are disposed on a surface of the second substrate facing the first substrate but not blocked by the printed circuit board, and second connecting bonding pads are disposed on a surface of the first substrate facing the second substrate and opposing the second bonding pads. The anisotropic conductive adhesive is disposed between the second bonding pads and the second connecting bonding pads, such that the second bonding pads are electrically coupled with the corresponding second connecting bonding pads. Second duplicated bonding pads are disposed on the surface of the first substrate facing the printed circuit board, the second connecting bonding pads are electrically coupled with the corresponding second duplicated bonding pads via the conductive wires, and second matching bonding pads are disposed on the surface of the printed circuit board facing the first substrate and opposing the second duplicated bonding pads.

DETAILED DESCRIPTION OF THE INVENTION

Figure 2A:
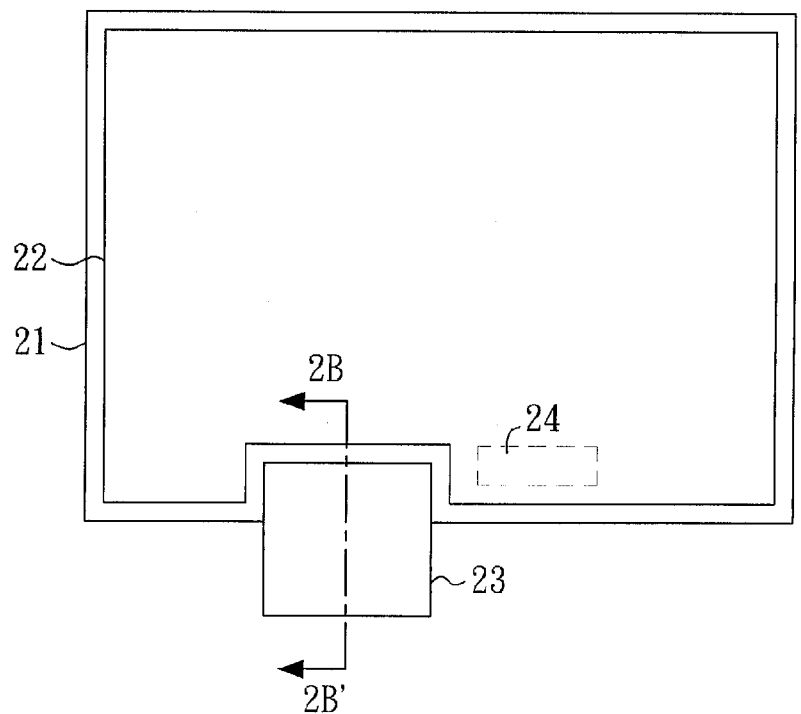
FIG. 2A shows a top view of a bonding structure according to one embodiment of the present invention.
Figure 2B:
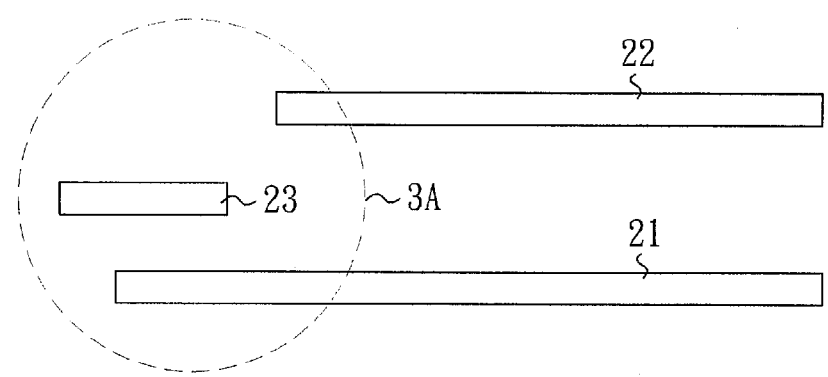
FIG. 2B shows a side view of FIG. 2A.

FIG. 2A shows a top view of a bonding structure 200 according to one embodiment of the present invention, and FIG. 2B shows a side view along a section line 2B-2B' of FIG. 2A. The bonding structure 200 of the embodiment is exemplified by, but not limited to, a touch panel.

As shown in FIG. 2B, the bonding structure 200 primarily includes a first substrate 21, a second substrate 22, and a printed circuit board (PCB) 23 disposed between the first substrate 21 and the second substrate 22. A portion of the PCB 23 is disposed on a periphery of the first substrate 21, and the other portion of the PCB 23 is disposed out of the first substrate 21. When the first substrate 21, the second substrate 22 and the PCB 23 are bonded together, signals of the first substrate 21 and the second substrate 22 may be transferred to or from other components via the PCB 23.

Take the touch panel as an example, the first substrate 21 mentioned above may be a glass substrate, the second substrate 22 may be a transparent substrate (such as an Indium tin oxide (ITO) film), and the PCB 23 may be a flexible PCB. The transparent substrate may be made of an insulating material, such as Polycarbonate (PC), Polyethylene terephthalate (PET), Polyethylen (PE), Poly vinyl chloride (PVC), Poly propylene (PP), Poly styrene (PS), Polymethyl methacrylate (PMMA) or Cyclic olefin copolymer (COC). The first substrate 21, the second substrate 22 and the PCB 23 bonded together may result in a glass-film (G1F) touch panel, in which a transparent substrate is laminated on a glass substrate, and two sensing layers (not shown) are formed on a surface of the first substrate 21 and on an opposing surface of the second substrate 22, respectively.

Figure 3A:
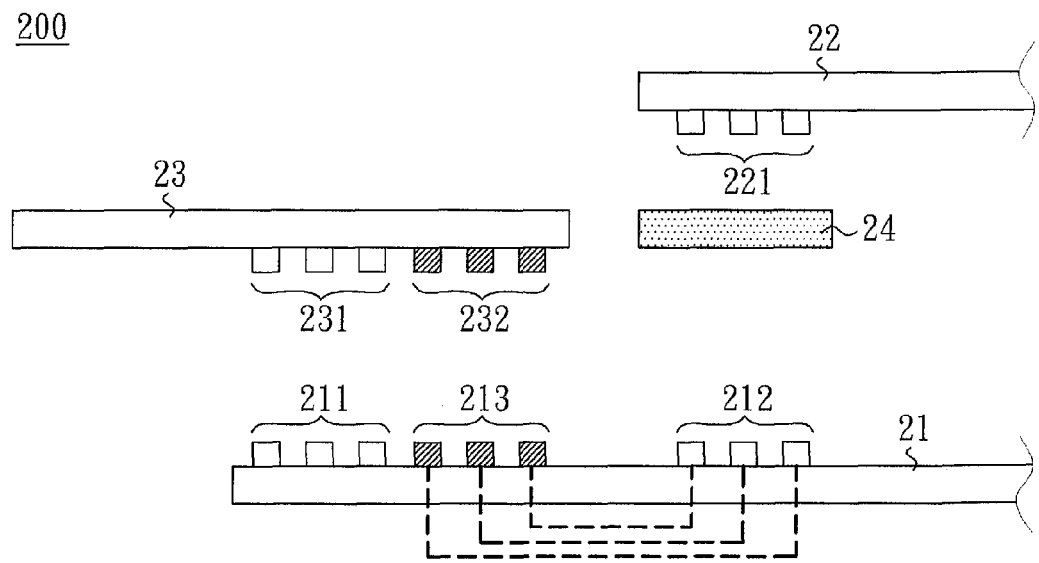
FIG. 3A shows a partially enlarged side view of FIG. 2B.

FIG. 3A shows a partially enlarged side view of an area 3A of FIG. 2B. As shown in FIG. 3A, plural first bonding pads 211 are disposed on a surface of the first substrate 21 facing the PCB 23. Plural first matching bonding pads 231 are disposed on a surface of the PCB 23 facing the first substrate 21 and opposing the first bonding pads 211. Moreover, plural second bonding pads 221 are disposed on a surface of the second substrate 22 facing the first substrate 21 (but not blocked by the PCB 23). Plural second connecting bonding pads 212 are disposed on a surface of the first substrate 21 facing the second substrate 22 and opposing the second bonding pads 221.

According to one aspect of the embodiment, anisotropic conductive adhesive (ACA) 24 is disposed between the second bonding pads 221 of the second substrate 22 and the second connecting bonding pads 212 of the first substrate 21. The ACA 24 may be provided in film as an anisotropic conductive film (ACF), or be provided in paste as an anisotropic conductive paste. According to characteristics of the ACA 24, electricity is conducted along a direction between the second substrate 22 and the first substrate 21, and electricity is blocked along other directions. Accordingly, the second bonding pads 221 may electrically coupled with the second conductive bonding pads 212 correspondingly.

Figure 3B:
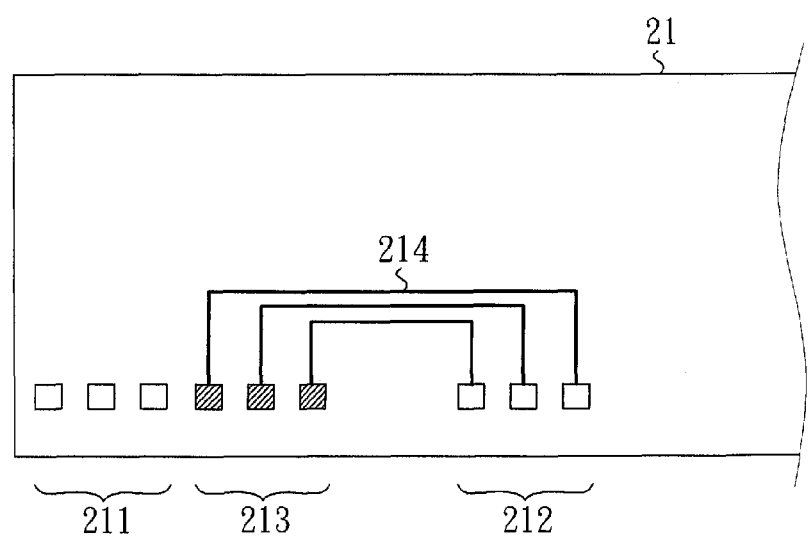
FIG. 3B shows a top view of the first substrate of FIG. 3A.
Figure 3C:
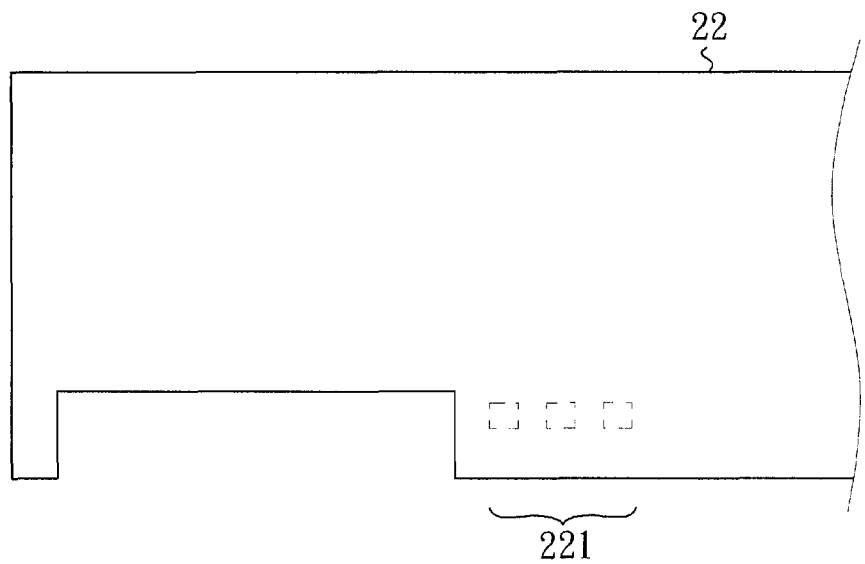
FIG. 3C shows a top view of the second substrate of FIG. 3A.

According to another aspect of the embodiment, plural second duplicated bonding pads 213 are disposed on a surface of the first substrate 21 facing the PCB 23. FIG. 3B shows a top view of the first substrate 21 of FIG. 3A, and FIG. 3C shows a top view of the second substrate 22 of FIG. 3A. As shown in FIG. 3B, the second connecting bonding pads 212 and the corresponding second duplicated bonding pads 213 are connected via conductive wires 214. Moreover, plural second matching bonding pads 232 are disposed on a surface of the PCB 23 facing the first substrate 21 and opposing the second duplicated bonding pads 213.

When the first substrate 21, the second substrate 22 and the PCB 23 are bonded together, the first bonding pads 211 of the first substrate 21 are electrically connected with the corresponding first matching bonding pads 231 of the PCB 23, such that signals of the first substrate 21 may be transferred to or from other components via the PCB 23. The second bonding pads 221 of the second substrate 22 are electrically coupled with the corresponding second connecting bonding pads 212 of the first substrate 21 via the ACA 24, are further electrically coupled with the corresponding second duplicated bonding pads 213 via the conductive wires 214, and are finally electrically connected with the corresponding second matching bonding pads 232 of the PCB 23, such that signals of the second substrate 22 may be transferred to or from other components via the PCB 23.

Figure 4:
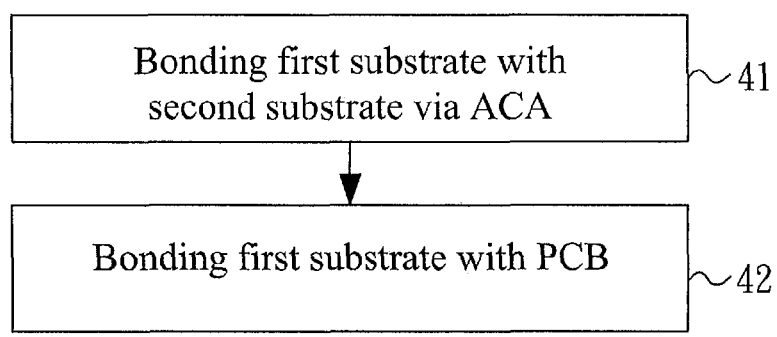
FIG. 4 shows a flow diagram illustrated of a bonding method according to one embodiment of the present invention.

FIG. 4 shows a flow diagram illustrated of a bonding method according to one embodiment of the present invention. In step 41, the first substrate 21 is first bonded with the second substrate 22. Specifically, the ACA 24 may be glued, for example, by thermal compression technique, between the second connecting bonding pads 212 of the first substrate 21 and the second bonding pads 221 of the second substrate 22. As a result, the second bonding pads 221 may be electrically coupled with the corresponding second connecting bonding pads 212 via the ACA 24, and are further electrically coupled with the corresponding second duplicated bonding pads 213 via the conductive wires 214. According to the characteristics of the ACA 24, no precise alignment is required in this step, which is thus not relevant to yield of the bonding structure 200.

Figure 1:
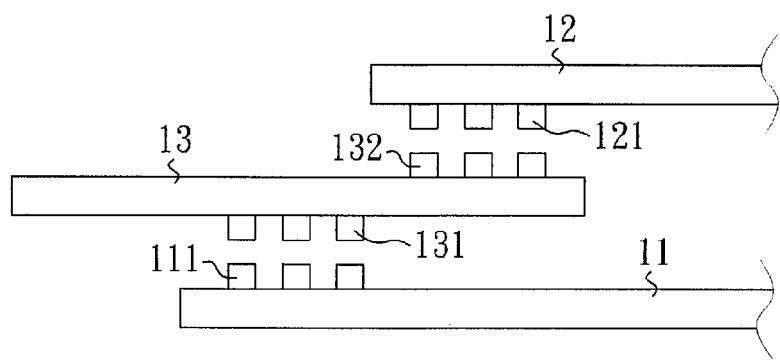
FIG. 1 shows a side view of a bonding structure of a conventional touch panel.

Subsequently, in step 42, the first substrate 21 is bonded with the PCB 23. Specifically, the first bonding pads 211 of the first substrate 21 are bonded with the corresponding first matching bonding pads 231 of the PCB 23, and the second duplicated bonding pads 213 of the first substrate 21 are bonded with the corresponding second matching bonding pads 232 of the PCB 23. As the first matching bonding pads 231 and the second matching bonding pads 232 of the PCB 23 are disposed on the same surface, a single bonding step is required to accomplish the bonding of the first bonding pads 211 of the first substrate 21 and the second bonding pads 221 of the second substrate 22. Therefore, the embodiment may enhance bonding yield as compared to the conventional two-step bonding process (as shown in FIG. 1).

Although specific embodiments have been illustrated and described, it will be appreciated by those skilled in the art that various modifications may be made without departing from the scope of the present invention, which is intended to be limited solely by the appended claims.

What is claimed is:

1. A bonding structure, comprising:
a first substrate;
a second substrate;
a printed circuit board disposed between the first substrate and the second substrate;
anisotropic conductive adhesive disposed between the first substrate and the second substrate; and
a plurality of conductive wires disposed on the first substrate;
wherein a plurality of first bonding pads are disposed on a surface of the first substrate facing the printed circuit board, and a plurality of first matching bonding pads are disposed on a surface of the printed circuit board facing the first substrate and opposing the first bonding pads;
wherein a plurality of second bonding pads are disposed on a surface of the second substrate facing the first substrate but not blocked by the printed circuit board, and a plurality of second connecting bonding pads are disposed on a surface of the first substrate facing the second substrate and opposing the second bonding pads;
wherein the anisotropic conductive adhesive is disposed between the second bonding pads and the second connecting bonding pads, such that the second bonding pads are electrically coupled with the corresponding second connecting bonding pads; and
wherein a plurality of second duplicated bonding pads are disposed on the surface of the first substrate facing the printed circuit board, the second connecting bonding pads are electrically coupled with the corresponding second duplicated bonding pads via the conductive wires, and a plurality of second matching bonding pads are disposed on the surface of the printed circuit board facing the first substrate and opposing the second duplicated bonding pads.

2. The structure of claim 1, wherein a portion of the printed circuit board is disposed on a periphery of the first substrate, and the other portion of the printed circuit board is disposed out of the first substrate.

3. The structure of claim 1, wherein the first substrate comprises a glass substrate.

4. The structure of claim 1, wherein the second substrate comprises a transparent substrate.

5. The structure of claim 1, wherein the printed circuit board comprises a flexible printed circuit board.

6. A bonding structure of a touch panel, the structure comprising:
a glass substrate;
a transparent substrate;
a flexible printed circuit board disposed between the glass substrate and the transparent substrate;
anisotropic conductive adhesive disposed between the glass substrate and the transparent substrate; and a plurality of conductive wires disposed on the glass substrate;

wherein a plurality of first bonding pads are disposed on a surface of the glass substrate facing the flexible printed circuit board, and a plurality of first matching bonding pads are disposed on a surface of the flexible printed circuit board facing the glass substrate and opposing the first bonding pads;

wherein a plurality of second bonding pads are disposed on a surface of the transparent substrate facing the glass substrate but not blocked by the flexible printed circuit board, and a plurality of second connecting bonding pads are disposed on a surface of the glass substrate facing the transparent substrate and opposing the second bonding pads;

wherein the anisotropic conductive adhesive is disposed between the second bonding pads and the second connecting bonding pads, such that the second bonding pads are electrically coupled with the corresponding second connecting bonding pads; and wherein a plurality of second duplicated bonding pads are disposed on the surface of the glass substrate facing the flexible printed circuit board, the second connecting bonding pads are electrically coupled with the corresponding second duplicated bonding pads via the conductive wires, and a plurality of second matching bonding pads are disposed on the surface of the flexible printed circuit board facing the glass substrate and opposing the second duplicated bonding pads.

7. The structure of claim 6, wherein a portion of the flexible printed circuit board is disposed on a periphery of the glass substrate, and the other portion of the flexible printed circuit board is disposed out of the glass substrate.

8. A bonding method, comprising:

bonding a first substrate with a second substrate using anisotropic conductive adhesive, such that anisotropic conductive adhesive is glued between a plurality of second connecting bonding pads of the first substrate and a plurality of second bonding pads of the second substrate; and bonding the first substrate with a printed circuit board, such that a plurality of first bonding pads of the first substrate are bonded with a plurality of corresponding first matching bonding pads of the printed circuit board, and a plurality of second duplicated bonding pads of the first substrate are bonded with a plurality of corresponding second matching bonding pads of the printed circuit board;

wherein the first matching bonding pads and the second matching bonding pads are disposed on a same surface of the printed circuit board; and wherein the second connecting bonding pads are electrically coupled with the corresponding second duplicated bonding pads via a plurality of conductive wires, which are disposed on the first substrate.

9. The method of claim 8, wherein the anisotropic conductive adhesive is glued between the first substrate and the second substrate by thermal compression technique.

10. The method of claim 8, wherein the first substrate comprises a glass substrate.

11. The method of claim 8, wherein the second substrate comprises a transparent substrate.

12. The method of claim 8, wherein the printed circuit board comprises a flexible printed circuit board.

13. A bonding method of a touch panel, the method comprising:

bonding a glass substrate with a transparent substrate using anisotropic conductive adhesive, such that anisotropic conductive adhesive is glued between a plurality of second connecting bonding pads of the glass substrate and a plurality of second bonding pads of the transparent substrate; and bonding the glass substrate with a flexible printed circuit board, such that a plurality of first bonding pads of the glass substrate are bonded with a plurality of corresponding first matching bonding pads of the flexible printed circuit board, and a plurality of second duplicated bonding pads of the glass substrate are bonded with a plurality of corresponding second matching bonding pads of the flexible printed circuit board;

wherein the first matching bonding pads and the second matching bonding pads are disposed on a same surface of the flexible printed circuit board; and wherein the second connecting bonding pads are electrically coupled with the corresponding second duplicated bonding pads via a plurality of conductive wires, which are disposed on the glass substrate.

14. The method of claim 13, wherein the anisotropic conductive adhesive is glued between the glass substrate and the transparent substrate by thermal compression technique.

* * * * *